US011316066B2

(12) United States Patent
Steudel et al.

(10) Patent No.: US 11,316,066 B2
(45) Date of Patent: Apr. 26, 2022

(54) METHOD FOR FABRICATING AN OPTICAL DEVICE

(71) Applicant: IMEC VZW, Leuven (BE)

(72) Inventors: Soeren Steudel, Oud-Heverlee (BE); Alexander Mityashin, Heverlee (BE); Eric Beyne, Heverlee (BE); Maarten Rosmeulen, Ghent (BE)

(73) Assignee: IMEC vzw, Leuven (BE)

(*) Notice: Subject to any disclaimer, the term of this patent is extended or adjusted under 35 U.S.C. 154(b) by 0 days.

(21) Appl. No.: 16/708,014

(22) Filed: Dec. 9, 2019

(65) Prior Publication Data
US 2020/0185566 A1 Jun. 11, 2020

(30) Foreign Application Priority Data
Dec. 10, 2018 (EP) ..................... 18211315

(51) Int. Cl.
H01L 33/00 (2010.01)
H01L 25/075 (2006.01)
(Continued)

(52) U.S. Cl.
CPC ...... H01L 33/0095 (2013.01); H01L 25/0753 (2013.01); H01L 27/14636 (2013.01);
(Continued)

(58) Field of Classification Search
CPC ............ H01L 33/0095; H01L 25/0753; H01L 27/14636; H01L 27/14643;
(Continued)

(56) References Cited

U.S. PATENT DOCUMENTS 9,923,013 B1 * 3/2018 Yamashita ........ H01L 27/14634
10,020,422 B1 7/2018 Oyer
(Continued)

FOREIGN PATENT DOCUMENTS

EP 1620902 B1 7/2010
EP 3024030 A1 5/2016
(Continued)

OTHER PUBLICATIONS

European Search Report, European Patent Application No. 18211315.9, dated May 27, 2019, 8 pages.
(Continued)

Primary Examiner — Victor A Mandala
(74) Attorney, Agent, or Firm — McDonnell Boehnen Hulbert & Berghoff LLP

(57) ABSTRACT

An optical device and a method for fabricating an optical device are described. The optical device may be a light emitting diode (LED) device, e.g. a micro-LED (μLED) device, or a photodiode (PD) device, e.g. an imager. The method comprises processing, on a first semiconductor wafer, an array including a plurality of compound semiconductor LEDs or compound semiconductor PDs and a plurality of first contacts, each first contact being electrically connected to one of the LEDs or PDs. The method further comprises processing, on a second semiconductor wafer, a CMOS IC and a plurality of second contacts electrically connected to the CMOS IC. The method further comprises hybrid bonding the first semiconductor wafer to the second semiconductor wafer such that the plurality of LEDs or PDs are individually connected to the CMOS IC via the first and second contacts.

15 Claims, 6 Drawing Sheets

(51) Int. Cl.
*H01L 27/146* (2006.01)
*H01L 33/06* (2010.01)
*H01L 33/62* (2010.01)

(52) U.S. Cl.
CPC .. *H01L 27/14643* (2013.01); *H01L 27/14698* (2013.01); *H01L 33/06* (2013.01); *H01L 33/62* (2013.01); *H01L 2933/0066* (2013.01)

(58) Field of Classification Search
CPC ... H01L 27/14698; H01L 33/06; H01L 33/62; H01L 2933/0066; H01L 27/156; H01L 33/0093; H01L 27/14634; H01L 25/167; H01L 27/153; H01L 33/48; H01L 27/14632; H01L 27/14687; H01L 27/1469; H01L 2933/0033
See application file for complete search history.

(56) References Cited

U.S. PATENT DOCUMENTS

| | | | |
|---|---|---|---|
| 10,204,950 B1* | 2/2019 | Yamashita | H01L 27/1464 |
| 2013/0126589 A1 | 5/2013 | Bibl et al. | |
| 2013/0285180 A1* | 10/2013 | Wang | H01L 27/1469 257/432 |
| 2013/0334638 A1* | 12/2013 | Chen | H01L 27/1464 257/432 |
| 2014/0042299 A1* | 2/2014 | Wan | H01L 27/14634 250/208.1 |
| 2016/0308103 A1 | 10/2016 | Hu et al. | |
| 2017/0186798 A1* | 6/2017 | Yang | H01L 27/14629 |
| 2018/0308832 A1 | 10/2018 | Shin et al. | |
| 2019/0088633 A1* | 3/2019 | Tao | H01L 33/0093 |
| 2019/0103433 A1* | 4/2019 | Yamashita | H01L 27/14636 |
| 2019/0103504 A1* | 4/2019 | Yamashita | H01L 31/107 |
| 2019/0157333 A1* | 5/2019 | Tsai | H01L 27/14634 |
| 2019/0302917 A1* | 10/2019 | Pan | G06F 3/044 |
| 2019/0355878 A1* | 11/2019 | Ahmed | H01L 33/502 |
| 2020/0083400 A1* | 3/2020 | Henry | H01L 33/06 |
| 2020/0176655 A1* | 6/2020 | Iguchi | H01L 33/382 |
| 2020/0286871 A1* | 9/2020 | Lift | H01L 23/5383 |
| 2020/0343230 A1* | 10/2020 | Sizov | H01L 33/0095 |

FOREIGN PATENT DOCUMENTS

| | | |
|---|---|---|
| TW | 201122708 A1 | 7/2011 |
| WO | 2004/097947 A2 | 11/2004 |
| WO | 2007/034367 A1 | 3/2007 |
| WO | 2010/149027 A1 | 12/2010 |
| WO | 2013/117944 A1 | 8/2013 |
| WO | 2017/068029 A1 | 4/2017 |

OTHER PUBLICATIONS

Day, Jacob et al., "III-Nitride Full-Scale High-Resolution Microdisplays", Applied Physics Letters, vol. 99, 031116, 2011, pp. 031116-1-031116-3.

Mo, Xiao-Fan et al., "Fabrication and Characterization of a GaN-Based 320X256 Micro-LED Array", Chin. Phys. Lett., vol. 34, No. 11, 2017, p. 118102-1-118102-4.

SW Kim, et al.; "Ultra-fine Pitch 3D Integration using Face-to-Face Hybrid Wafer Bonding Combined with a Via-Middle Through-Silicon-Via Process", IEEE, ECTC, 2016, DOI 10.1109/ECTC.2016.205.

European Patent Office; Communication pursuant to Article 94(3) EPC, Application No. EP18211315.9, dated Feb. 11, 2022, 7 pages.

* cited by examiner

METHOD FOR FABRICATING AN OPTICAL DEVICE

CROSS-REFERENCE TO RELATED APPLICATIONS

The present application is a non-provisional patent application claiming priority to EP 18211315.9, filed Dec. 10, 2018, the contents of which are hereby incorporated by reference.

FIELD OF THE DISCLOSURE

This description relates to the technical field of optical devices. The description proposes a method for fabricating an optical device, and presents the optical device itself. For example, the optical device is a light emitting diode (LED) device, such as a micro-LED (μLED) device, or is a photodiode (PD) device, such as a photodiode-based imager. The method and optical device, respectively, are applicable for a μLED display.

BACKGROUND

In order to enable the next generation augmented reality (AR) glasses, strongly improved projection micro-display technology is required in terms of resolution, brightness and energy consumption compared to existing displays, particularly Organic Light Emitting Diode (OLED), Liquid Crystal on Silicon (LCOS) or Digital Light Processing (DLP) displays. The most promising micro-display technology under development is a μLED display employing one or more μLED devices on Complementary Metal-Oxide-Semiconductor (CMOS). This technology targets a resolution of approximately 3 micrometer (μm) LED pixel pitch, with a brightness exceeding 1 million nits and with efficiencies of at least a 10% External Quantum Efficiency (EQE).

The main challenge in developing new μLED devices is how to integrate the very closely spaced LEDs, which are commonly made using a III-V or III-N (e.g. GaN) semiconductor material (epitaxial layer) on a 4"-6" wafer, with a Si-CMOS (active matrix readout) IC, typically made on a 8"-12" wafer. That is a way to achieve the integration with a sufficiently small LED pixel pitch, while not causing too much efficiency drop of the LEDs. Notably, efficiency drops are quite common to scaled LEDs.

In this respect, regardless of how the integration is done, the EQE of a given scaled LED can be a secondary concern, which is directly linked to the aperture or fill factor of the active light emitting area of the LED. A scaled III-N or III-V LED has non-radiative recombination at the sidewalls of the MESA edge due to defects, which is severe within the diffusion length of the charge carriers. The efficiency drop of such a scaled LED is therefore mostly related to perimeter to area ratio of the LED. In the context of a LED array with a fixed target resolution (e.g. 3 μm), this means that the active semiconductor area should be as large as possible compared to the size of the LED pixel as a whole, wherein the LED pixel includes also the distance to an adjacent LED. In the following, this is referred to as LED aperture or fill factor.

Similar issues as described above with respect to the fabrication of a LED device, arise also when a PD device with very closely spaced PDs (light capturing diodes) is to be integrated with a CMOS IC. For instance, when an imager with a very small PD pixel pitch is to be fabricated.

SUMMARY

In view of the above-mentioned challenges, the described embodiments provide improvements to the fabrication of an optical device, such as a LED device suitable for a μLED display, or of a PD device. At least some of the embodiments allow for fabrication and providing an optical device with an array having a very small pixel pitch but a high efficiency. For example, very little efficiency drop should be experienced when scaling LEDs or PDs. The LED device can be a μLED device with a LED pixel pitch of 3μm or less. Likewise for a PD device, a PD pixel pitch of 3 μm or less is an option. The embodiments allow the fabrication process for the optical device to be efficient and to achieve high yields, and for the optical device to overall have a compact size.

Several conventional integration options would in principle be available for integrating compound semiconductor LEDs or PDs (front-plane) with a CMOS readout (back-plane), but only some integration options are both suitable for full wafer monolithic integration, and have the capability to achieve the required integration target. Furthermore, not all integration options available for monolithic integration are also suitable for achieving the very small LED or PD pixel pitches needed, for example, for a μLED display, while at the same time avoid or suppress efficiency drops of the LEDs or PDs.

Regardless of the integration method selected for combining compound semiconductor LEDs or PDs with a CMOS readout IC, for at least some embodiments, vias are not present within the LED/PD array (especially not Through Silicon Vias (TSVs) or super-vias) for connecting the LEDs or PDs with the CMOS IC. Having vias outside the array is not a problem.

In addition, at least some of the embodiments take into account that any approach that leads towards a bottom LED contact having a size larger than, e.g., the MESA etched quantum well of the LED, would negatively impact the efficiency of the LED. Furthermore, it is considered that any integration method that might not allow etching the quantum well of a LED, but only the doped injection layers, would be superior in performance at scaled dimensions.

Based on at least the above considerations, an embodiment of the invention proposes a method (process flow) that employs wafer-to-wafer (W2W) hybrid bonding to integrate LEDs or PDs with a CMOS IC. The method avoids vias in the LED/PD array and realizes a bottom contact that is not larger than a quantum well area of a LED or than the active diode area of a PD. The method may be split into a process flow for the LED/PD array, which may be done before the W2W hybrid bonding, and a post-process flow for the LED/PD array, which may be done after the W2W hybrid bonding.

In a first aspect, a method for fabricating an optical device is provided. The method comprises: processing an array including a plurality of compound semiconductor LEDs or compound semiconductor PDs on a first semiconductor wafer, processing a plurality of first contacts on the first semiconductor wafer, each first contact being electrically connected to one of the LEDs or PDs, processing a CMOS IC on a second semiconductor wafer, processing a plurality of second contacts electrically connected to the CMOS IC on the second semiconductor wafer, and hybrid bonding the first semiconductor wafer to the second semiconductor wafer such that the plurality of LEDs or PDs are individually connected to the CMOS IC via the first and second contacts.

By using the W2W hybrid bonding to bond the first semiconductor wafer to the second wafer, an integrated optical device including an LED/PD array and a CMOS readout can be fabricated with a target resolution of a LED/PD pixel pitch of 3 μm or even less. As an example, the two semiconductor wafers can be processed separately, and can then be hybrid bonded to integrate the array and the CMOS readout.

The first semiconductor wafer may include a carrier substrate (carrier wafer), the array on the carrier wafer, and further layers processed on the carrier wafer and/or array, which result in a bonding surface above the array. To this end, the processing of the array on the first semiconductor wafer may mean that first a plurality of LEDs or PDs are structured from compound semiconductor LED or PD layers provided on the carrier wafer, and then the bonding surface is obtained, in order to obtain the bond-ready first semiconductor wafer. After bonding the first semiconductor wafer to the second semiconductor wafer, via the bonding surface, the carrier wafer may be removed.

Processing the array does not necessarily mean that no further post-processing can be applied, in order to finalize the array or the individual LEDs or PDs, respectively. In other words, the array does not have to be processed completely before the hybrid bonding occurs. However, the array should be processed at least to the extent that at least one contact of the LED or PD including the active areas for each LED or PD are already processed.

The compound semiconductor LEDs or PDs of the array are LEDs or PDs based on or made from a compound semiconductor material, in particular from a III-V or II-VI semiconductor material. For example, the LEDs may be GaN-based LEDs, e.g., LEDs made from GaN and/or AlGaN. As another example, the LEDs may be made from AlGaInP. The PDs may be InP-based PDs, e.g., PDs made from InP. Further, multiple optical devices may be fabricated in parallel, thus, a plurality of LED/PD arrays may be processed on the first semiconductor wafer. The processing of the arrays on the first semiconductor wafer may in this case include obtaining a plurality of compound semiconductor stacks, each stack including an LED or PD layer and corresponding to one of the optical devices/arrays, which are reconstituted on a silicon-based carrier wafer.

In at least some implementations of the method, the array is processed without any VIA through the array between the plurality of LEDs or PDs.

Thus, the LED/PD pixel pitch can be reduced, while at the same time the LED/PD apertures can be maximized. This arrangement of the array in combination with the hybrid bonding leads the way for fabricating improved devices, such as μLED devices, with very high target resolution, or imagers with very high resolution.

In at least some implementations of the method, the array includes a plurality of LEDs and processing the array on the first semiconductor wafer comprises: growing or transferring LED layers on the first semiconductor wafer. The LED layers include quantum well layers and a highly-doped contact layer on the quantum well layers, and structuring the plurality of LEDs by etching the LED layers. The highly-doped contact layer is etched but the quantum well layers are not etched.

In this way, the LED layers including the active area for each LED may be processed. The active area of each LED is defined by the non-etched quantum well layers. The etching is referred to as a partial MESA etch, since it is stopped at the quantum well layers after the highly-doped contact layer is etched. The partial MESA etch reduces efficiency losses caused by scaling the LEDs. That means, a smaller LED pixel pitch becomes possible. The partial MESA etch is in particular feasible in the context of the method of the first aspect.

In at least some implementations of the method, each first contact is electrically connected to a different one of the LEDs or PDs from below.

In at least some implementations of the method, processing, before the hybrid bonding, the plurality of first contacts on the first semiconductor wafer comprises: processing a plurality of contact layers, each contact layer being applied to the bottom surface of a different one of the LEDs or PDs, and processing a plurality of VIAs, each VIA being electrically connected to one of the contact layers from below and extending from the contact layer to the bonding surface of the first semiconductor wafer.

In this way, the array connected to the CMOS IC can have a very small pixel pitch. The contact layers may be p-contacts or n-contacts.

In an implementation of the method, a size of each contact layer is equal to or smaller than a size of an active area of the LED or PD, to which it is applied.

This allows maximizing the LED/PD apertures in the array, and thus reducing the pixel pitch.

In an implementation, the method further comprises, after the hybrid bonding, processing at least one third contact on the first semiconductor wafer. The at least one third contact can be electrically connected to the plurality of LEDs or PDs from above.

In this document, the terms "above" and "below" relate to the orientation of the LEDs or PDs and particularly the light emission/capturing axis/direction of the array. "Above" or "top" is the side where the array emits light. "Below" or "bottom" is the opposite side. Any element referred to as being "below" the LEDs/PDs or the array does thus not interfere with the emitting/capturing of the light.

In an implementation of the method, the at least one third contact is transparent for LED light or light to be captured by the PDs and is connected to several or to each of the plurality of LEDs or PDs.

Accordingly, the third contact may be a common contact of LEDs/PDs of the array, thus simplifying the fabrication process and beneficial for achieving a small pixel pitch.

In an implementation, the method further comprises, after the hybrid bonding, processing at least one electrical connection element, such as a VIA, connecting the at least one third contact to the CMOS IC. The electrical connection element is passed by or around the array.

Accordingly, in at least some implementations, the at least one electrical connection element is not passed through the array, and therefore does not negatively impact the LED/PD apertures nor the pixel pitch. The electrical connection element is thus arranged outside of the array. That means, in a top view of the array, the electrical connection element is located next to the array. As an example, the electrical connection element may be vertical, but located at a certain distance laterally from the array, or may circle around the array.

In at least some implementations of the method, a plurality of electrical connection elements is processed, the plurality of electrical connection elements being arranged with a lower density than the plurality of first contacts and second contacts.

The higher density of the arrangement of the first and second contacts allows achieving the high pixel resolution in an overall compact optical device.

In at least some implementations, the method further comprises, after the hybrid bonding: processing a conductive grid, particularly using a damascene process, electrically connected to the at least one third contact from above.

The conductive grid may distribute current and heat efficiently in the optical device, particularly to/away from the array. In at some of the implementations, the grid may also serve as a diaphragm located above the array, in order to produce a narrow emission angle of a LED device, or may serve to focus light onto the PDs in a PD device.

In at least some implementations of the method, the array has a pixel pitch of the plurality of LEDs or PDs between 1-10 μm, in particular equal to or below 3 μm.

Accordingly, the method may fabricate a μLED device suitable for application in a μLED display, or a μPD device suitable as a high-resolution imager.

In a second aspect, an optical device is provided. The optical device comprises a first semiconductor part comprising an array including a plurality of compound semiconductor LEDs or compound semiconductor PDs, and a plurality of first contacts. Each first contact being electrically connected to one of the LEDs or PDs from below. The optical device also comprises a second semiconductor part arranged below the first semiconductor part and comprising a CMOS IC and a plurality of second contacts electrically connected to the CMOS IC. The first semiconductor part is hybrid bonded to the second semiconductor part. The plurality of first contacts are directly connected one-by-one to the plurality of second contacts.

The optical device of the second aspect can be fabricated with the method of the first aspect and its implementation forms. After bonding the first semiconductor wafer to the second semiconductor wafer, post-processing and dicing of the bonded wafers may yield multiple optical devices.

The optical device of the second aspect may be a μLED or μPD device with a very high LED/PD resolution in the array, and is thus well suited to be implemented in, e.g., a μLED display or a high-resolution imager. The fact that the first contacts are directly contacted to the second contacts, not for instance by means of some flip-chip bond bumps, is a clear fingerprint of the hybrid bonding, which allows moving to smaller pixel pitches.

In at least some implementations of the optical device, the array comprises no VIA between the plurality of LEDs or PDs.

In this way, the LEDs/PDs apertures in the array can be maximized, i.e., the LED or PD surfaces with respect to the overall array area.

In at least some implementations, the optical device further comprises at least one third contact electrically connected to the plurality of LEDs or PDs from above. The at least one third contact is transparent for LED light or light to be captured by the PDs and is connected to several or to each of the plurality of LEDs or PDs.

The third contact may be a common contact connecting several or even all LEDs or PDs. The common contact may be transparent at least for the LED light or for light to be captured. In at least some implementations, the third contact may block other electromagnetic radiation.

In at some of the implementations of the optical device, the at least one third contact is electrically connected to the CMOS IC by at least one electrical connection element arranged outside of the array.

In this way, the optical device can be designed very compactly, since no electrical connection element runs through the array, which allows moving the LEDs or PDs closer together without reducing the LED/PD apertures.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
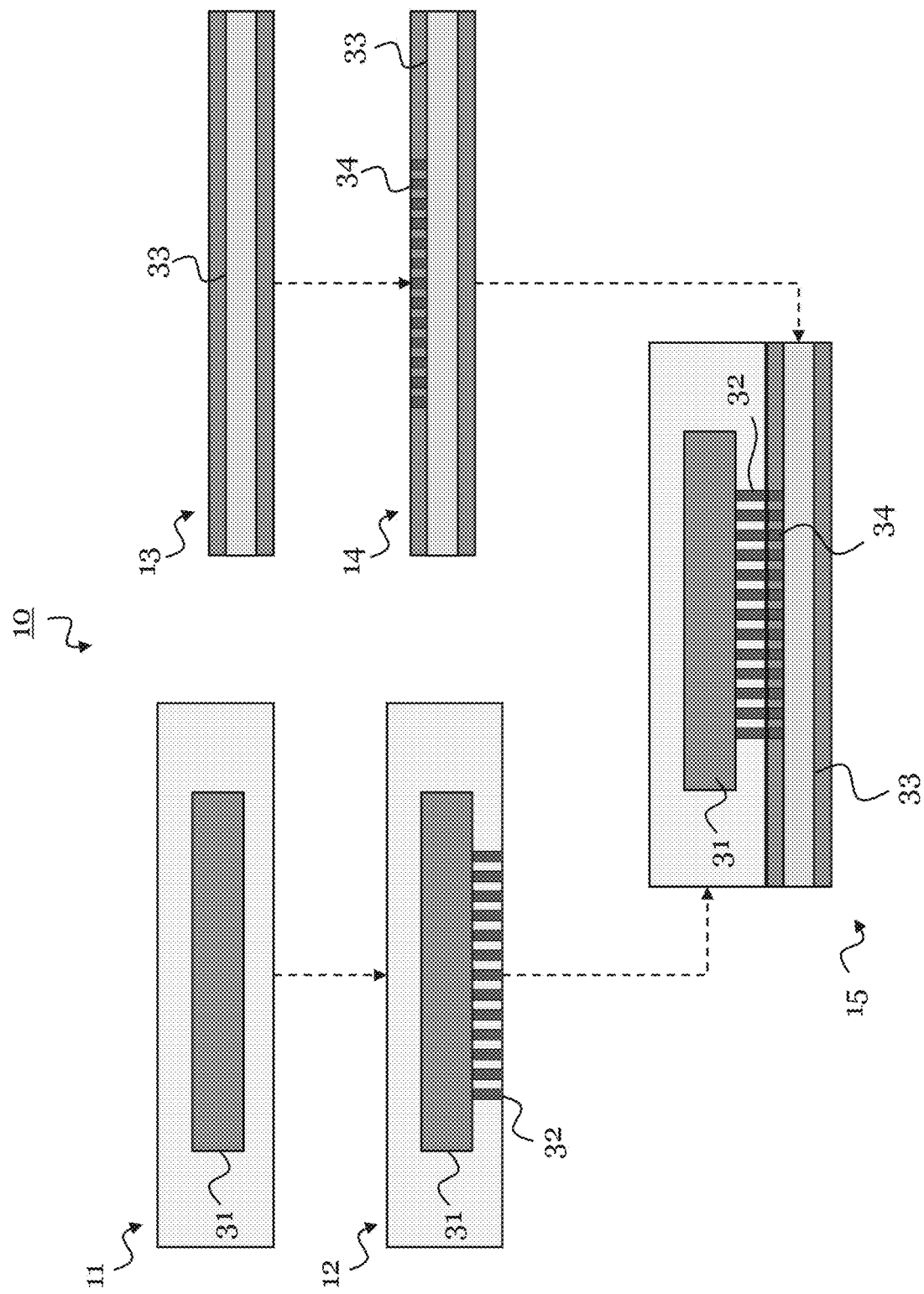
FIG. 1 shows a flow-diagram of a method according to an example embodiment.

FIG. 1 shows a method 10 according to an example embodiment in a flow-diagram. The method 10 can be performed to obtain an optical device 30 (see FIG. 3 for more details on optical device 30). As an example, the optical device 30 can include an array 31, such as a μLED or μPD array. Thus, the method 10 may, for example, be applied in a fabrication process of a μLED display that includes a LED device, such as the optical device 30.

In item of the method 10, an array 31 including a plurality of compound semiconductor LEDs or compound semiconductor PDs 31a (see, e.g., FIG. 3) is processed on a first semiconductor wafer.

In item 12 of the method 10, a plurality of first contacts 32 is processed on the first semiconductor wafer, each first contact 32 being electrically connected to one of the LEDs or PDs 31a.

In item 13 of the method 10, a CMOS IC 33 is processed on a second semiconductor wafer.

In item 14 of the method 10, a plurality of second contacts 34 electrically connected to the CMOS IC 33 is processed on the second semiconductor wafer.

In item 15 of the method 10, the first semiconductor wafer is hybrid bonded to the second semiconductor wafer such that the plurality of PDs or LEDs 31a are individually connected to the CMOS IC 33 via the first and second contacts 32, 34.

Figure 2:
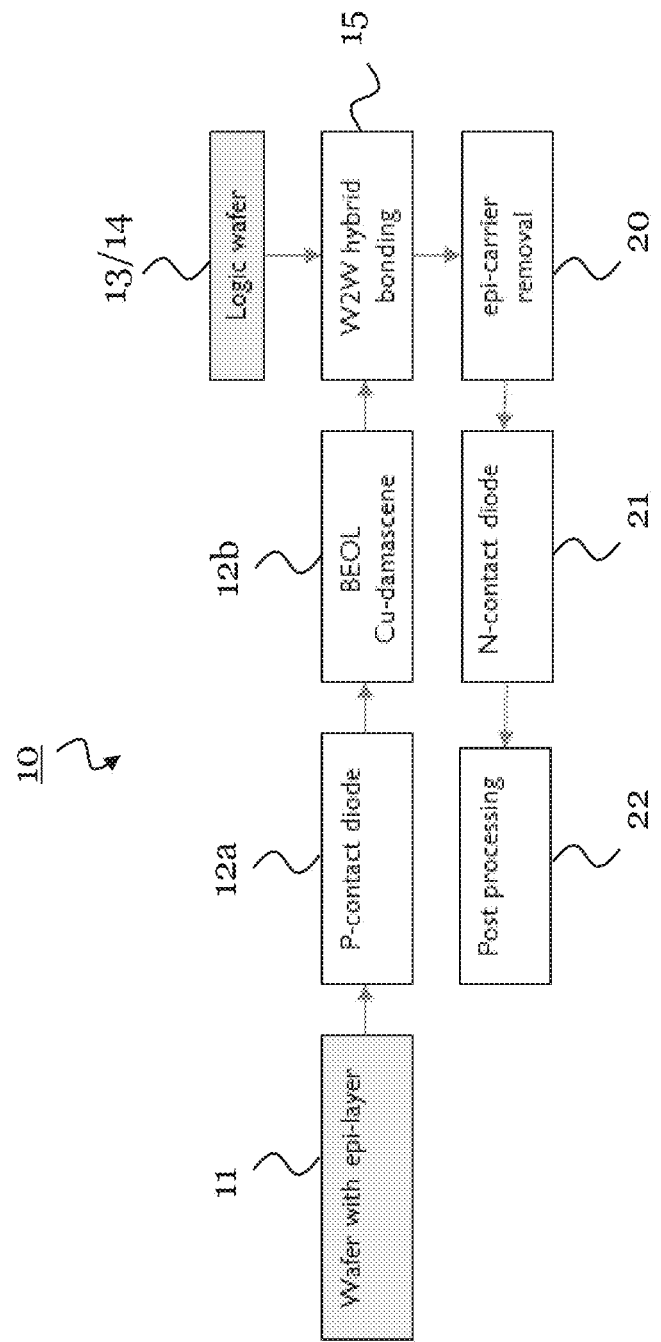
FIG. 2 shows a detailed method (process flow) according to an example embodiment. The method can be used to realize an optical device on CMOS with W2W hybrid bonding, wherein a maximum LED/PD aperture at the smallest pixel pitch can be achieved.

FIG. 2 shows a method 10 according to an example embodiment, which is based on the method 10 shown in FIG. 1. The method 10 shown in FIG. 2 includes the items 11-15 shown in FIG. 1, and may include additional items.

At item 11, in which the array 31 is processed, the first semiconductor wafer may be provided with epitaxially grown (epi) LED layers or PD layers, particularly based on a compound semiconductor material. For example, a compound semiconductor material stack including each of the epi LED/PD layers may be provided on the first semiconductor wafer. For example, the epi LED/PD layers may be disposed on a carrier wafer (e.g., for LEDs 31a, these may be GaN, AlGaInP or GaN-on-sapphire on a Si carrier wafer, such as a 300 mm wafer; and for PDs 31a, these may be InP on such a Si carrier wafer). The epi LED layers may include layers defining a quantum well (i.e., quantum well layers) and a highly-doped contact layer provided on the quantum well layers. The method 10 may include performing a MESA etch of the epi LED layers, in order to define the areas of the individual LEDs 31a in the array 31. In some implementations, the MESA etch of the epi LED layers may be a full MESA etch, which includes etching through the quantum well layers. In some implementations, the MESA etch may be a partial MESA etch, which includes only etching through the highly-doped contact layer, but stopping the etch at the quantum well layers. That is, the quantum well layers are not etched, if a partial MESA etch is performed. The epi PD layers may include layers defining a PiN diode of a PD 31a. The array 31 does not have to be completely finalized in item 11, for instance, regarding contacting, but the LED/PD layers should already be structured into the arrangement of the LEDs or PDs 31a in the array 31.

Item 12 of processing the plurality of first contacts 32 on the first semiconductor wafer may be divided into two items 12a and 12b as shown in FIG. 2. At item 12a, a contact layer 32a (see e.g. FIG. 3) may be processed onto each LED or PD 31a. The contact layer 32a can be referred to as a "bottom contact" due to its arrangement below the LED or PD 31a in the final optical device 30. The bottom contact layer 32a can either be a p-contact or n-contact (FIG. 2 only as an example refers to a p-contact, an n-contact is here likewise possible). Afterwards, at item 12b, a conventional Back End of Line (BEOL) damascene process, e.g., using Cu, W, or Ru as the metal, may be used to create VIAs 32b (see e.g. FIG. 3). The VIAs 32b electrically connect to the plurality of contact layers 32a with one side, and end with their other side at a bonding surface of the first semiconductor wafer. That is, each of these VIAs 32b is electrically connected to one of the contact layers 32a from below, and extends from the contact layer 32a to the bonding surface of the first semiconductor wafer. In particular, the VIAs 32b are exposed at the bonding surface of the first semiconductor wafer. The bonding surface of the first semiconductor wafer may be a Chemical-Mechanical Planarization (CMP) flat surface with the VIAs 32b functioning as contact regions/pads and an anionic bonding layer (e.g. SiN, SiCN, $SiO_2$).

At items 13/14, the CMOS IC 33 and the second contacts 34 are processed on the second semiconductor wafer. To this end, a CMOS wafer containing an active matrix and additional signal processing functions may be provided. Like the first semiconductor wafer, the second semiconductor wafer can be provided with a bonding surface, which may be a CMP flat surface with the second contacts 34 functioning as contact regions/pads and an anionic bonding layer (e.g. SiN, SiCN, $SiO_2$). In particular, the second contacts 34 are exposed with one of their ends at the bonding surface of the first semiconductor wafer, while their second end connects to the CMOS IC 33.

At item 15, the second semiconductor wafer is bonded by (e.g., conventional) W2 W hybrid bonding to the first semiconductor wafer. A conventional hybrid bonding technique that may be used is, for instance, described in 'SW Kim et al., "*Ultra-fine Pitch 3D Integration Using Face-to-Face Hybrid Wafer Bonding Combined with a Via-Middle Through-Silicon-Via Process*", IEEE, ECTC, 2016, DOI #10.1109/ECTC.2016.205.' The W2 W hybrid bonding can, especially in a 300 mm platform, lead to a pitch down to 2 μm or even 1.5 μm.

At item 20, the carrier wafer for the Epi layers of the first semiconductor wafer may be removed, for example, by any means known in the state of the art. This removal process may, for example, include grinding and/or CMP, or the like. In at least some embodiments, an Si carrier wafer is removed.

At item 21, at least one further contact layer 35 (see e.g. FIG. 3) may be processed for contacting each LED or PD 31a. The further contact layer 35 can be referred to as a "top contact" due to its arrangement above the LEDs or PDs 31a in the final optical device 30. The at least one top contact layer 35 can be a p-contact or n-contact, wherein it should be of the opposite conductivity type than the bottom contact layer 32a described above (FIG. 2 only as an example refers to it as an n-contact, a p-contact is here likewise possible). The top contact 35 may particularly be a common top contact 35 connected to several or each LED or PD 31a. The at least one top contact 35 is an example of the at least one third contact mentioned above, which connects to the plurality of LEDs or PDs 31a from above.

At item 22, after the top contact 35 is processed, additional processing can be completed, e.g., in order to improve current and heat distribution in the optical device 30 or the optical out-coupling from the optical device 30. For instance, a metallization grid 40 (see FIG. 4) may be processed above the array 31. The metallization grid 40 can distribute current and heat, and/or can function as an optical element, e.g., an optical diaphragm. In at least some implementations, the grid 40 may be connected to the top contact 35, and may include apertures arranged over the array 31. Alternatively or additionally, micro-lenses may be arranged above each LED or PD 31a of the array 31, e.g., to focus light emitted by the LED 31a or focus received light onto the PD 31a. The additional processing may further include dicing the wafer into multiple optical devices 30 and packaging the optical devices 30.

Figure 3:
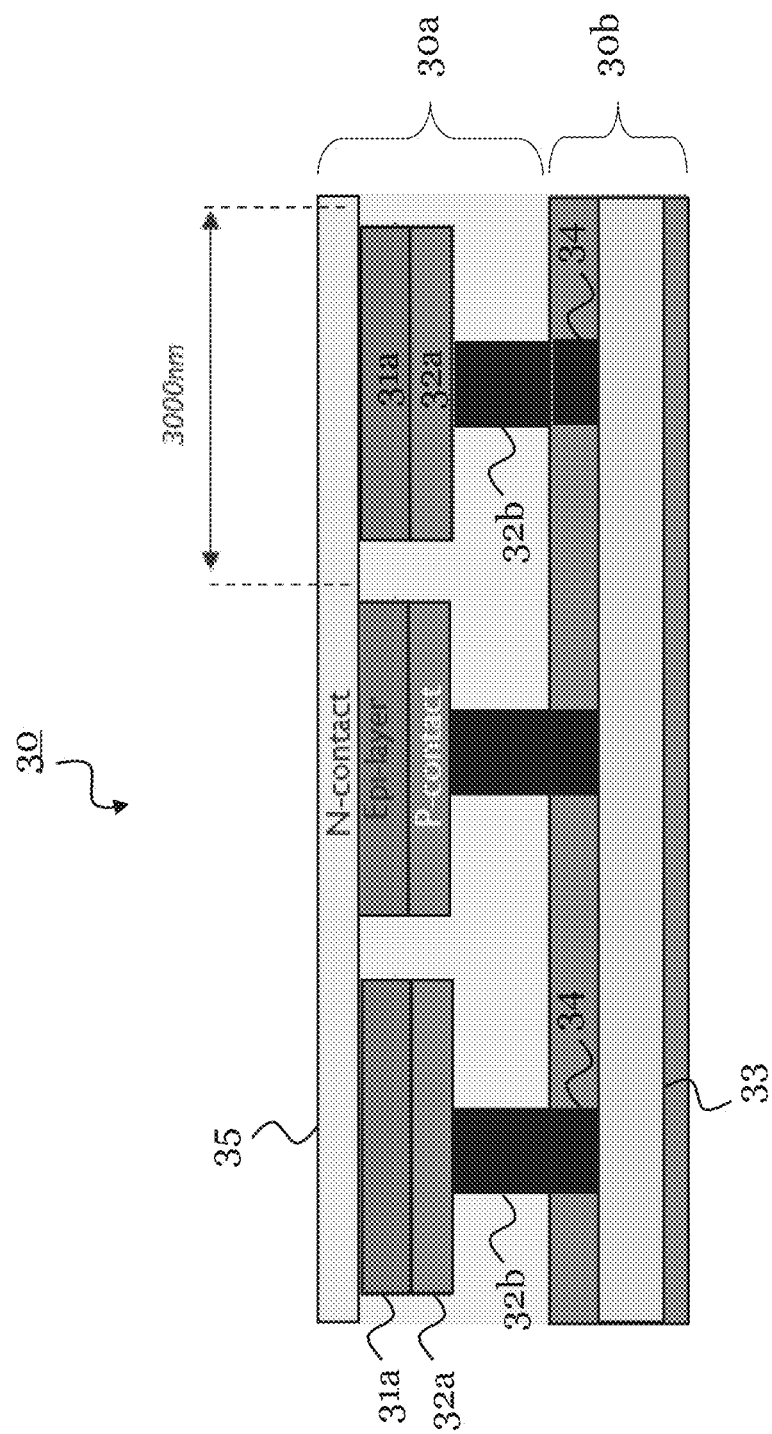
FIG. 3 shows a schematic cross-section of an optical device according to an example embodiment. This optical device can be realized with the method.

FIG. 3 shows a cross-section of an optical device 30 according to an example embodiment. The optical device 30 may result from the method 10 described with respect to FIG. 1. The optical device 30 may be a LED device, such as a μLED device with a LED pixel pitch of 3 μm or less. The optical device 30 may also be a PD device, such as a (near) infrared imager including, e.g., a plurality of InP-based PDs 31a with a PD pixel pitch of 3 μm or less.

The optical device 30 comprises a first semiconductor part 30a and a second semiconductor part 30b. The first semiconductor part 30a is hybrid bonded to the second semiconductor part 30b, such as how the two semiconductor wafers described above are bonded for the method 10

The first and second semiconductor part 30a, 30b may be parts of the first and second semiconductor wafer, respectively, e.g., obtained after wafer dicing.

The first semiconductor part 30a comprises an array 31 including a plurality of compound semiconductor LEDs or compound semiconductor PDs 31a and comprises a plurality of first contacts 32. Each first contact 32 (here composed of 32a+32b) is electrically connected to one of the LEDs or PDs 31a from below. The array 31 and the first contacts 32 may be as described above with respect to the method 10.

The second semiconductor part 30b is arranged below the first semiconductor part 30a and comprises a CMOS IC 33 and a plurality of second contacts 34 electrically connected to the CMOS IC 33. The CMOS IC 33 and the plurality of second contacts 34 may be as described above with respect to the method 10.

The two semiconductor parts 30a and 30b are particularly bonded together in such a manner that the plurality of first contacts 32 is directly connected one-by-one to the plurality of second contacts 34. This is achievable by using the W2W hybrid bonding employed by the method 10 described above.

FIG. 3 shows additional features of the optical device 30 in accordance with at least some embodiments. FIG. 3 shows in particular a cross-section of the optical device 30 as it results after item 21 of the method 10 shown in FIG. 2. Accordingly, in at least some embodiments, the optical device 30 includes a common top contact 34 (the at least one third contact made in item 21) electrically connected to the plurality of LEDs or PDs 31a from above. The top contact 35 is transparent for at least LED light or for the light to be captured by the PDs 31a, i.e., the light of interest, and is here connected to all of the plurality of LEDs or PDs 31a. The top contact 35 is configured to pass at least the light of interest emitted by the LEDs or PDs 31a. The transparent top contact 35 may, however, filter electromagnetic radiation other than the light of interest of the LEDs or PDs 31a.

According to the items 12a and 12b of the method 10 shown in FIG. 2, the plurality of first contacts 32 include a plurality of bottom contact layers 32a, each applied to the bottom surface of one LED or PD 31a, and a plurality of VIAs 32b, each VIA 32b being electrically connected to one of the bottom contact layers 32a from below, and extending to the interface formed by the first semiconductor part 30a and the second semiconductor part 30b. The VIAs 32b are further connected directly and one-by-one to the plurality of second contacts 34 connected to the CMOS IC 33.

It can also be seen in FIG. 3 that no electrical connection, like a VIA or other connection element, passes through the array 31, i.e., between LEDs or PDs 31a. In other words, the area occupied by the plurality of LEDs or PDs 31a is free from any other connection elements, particularly free from VIAs. In this way, for a target LED/PD pixel pitch of 3 μm or less, more than 80% of the area of a pixel can be occupied by the LED or PD 31a (i.e., the LED/PD surface, here specifically a LED/PD island).

Figure 4:
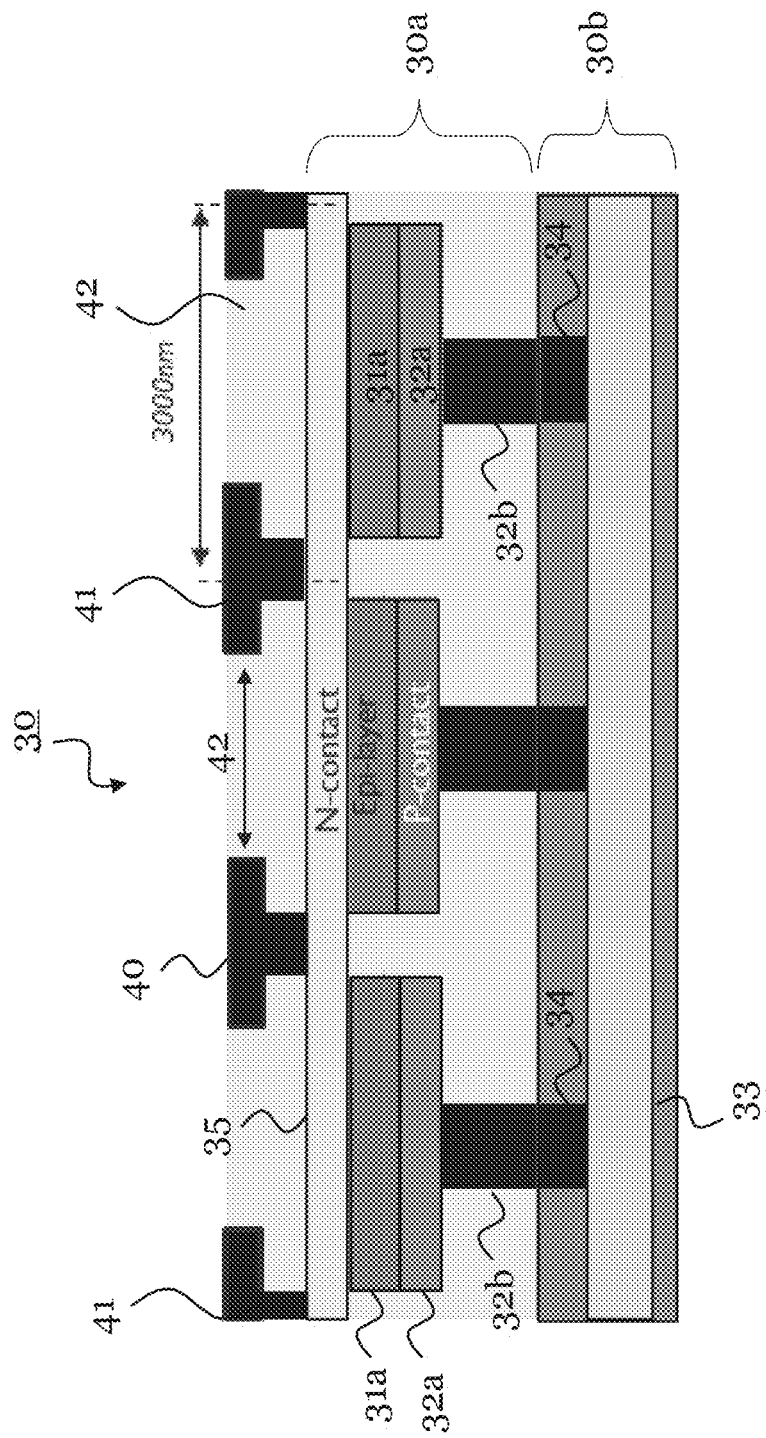
FIG. 4 shows a schematic cross-section of an optical device according to an example embodiment. This optical device can be realized with the method including post processing.

FIG. 4 shows a cross-section of an optical device 30 according to an example embodiment, which is based at least in part on the optical device 30 shown in FIG. 3. Same elements in FIG. 3 and FIG. 4 share the same reference signs and function likewise. For example, FIG. 4 shows the optical device 30 as resulting after item 22 of the method 10 shown in FIG. 2. For instance, after the formation of the top contact 35 at item 21, further aspects of the process might be implemented at item 22, e.g., adding a damascene metallization grid 40 for better current and heat distribution. The metallization grid 40 may be electrically connected to the top contact 35 from above, and can thus serve as a current and heat distributor.

The grid 40 may comprise a plurality of transparent openings 42, each transparent opening 42 being related to, particularly positioned above, one of the plurality of compound semiconductor LEDs or PDs 31a. Each transparent opening 42 may be configured to pass at least the light emitted by the LED 31a it is related to, or the light that the PD 31a it is related to should capture. Further, the metallization grid 40 may be connected to determined regions of a top surface of the top contact 35, wherein, the determined regions are positioned above the spaces between adjacent LEDs or PDs 31a in the array 31. For example, the grid 40 may have a plurality of vertical posts 41, the vertical posts 41 being positioned above the spaces between the plurality of LEDs or PDs 31a and configured to separate adjacent LEDs or PDs 31a of the array 31 from each other. The transparent openings 42 may be provided above the vertical posts 41. The vertical posts 41 help to, for instance, avoid that light emitted by one of the LEDs 31a exits the transparent opening 42 related to another one of the LEDs 31a. To this end, the vertical posts 41 may be light absorbing, at least for the LED light. To this end, the posts 41 may be coated with an absorptive layer, e.g., a carbon layer. A distance between the posts 41 arranged above spaces between different adjacent LEDs or PDs 31s may be in the order of the LED/PD pixel pitch, such as 3μm as shown.

Figure 5:
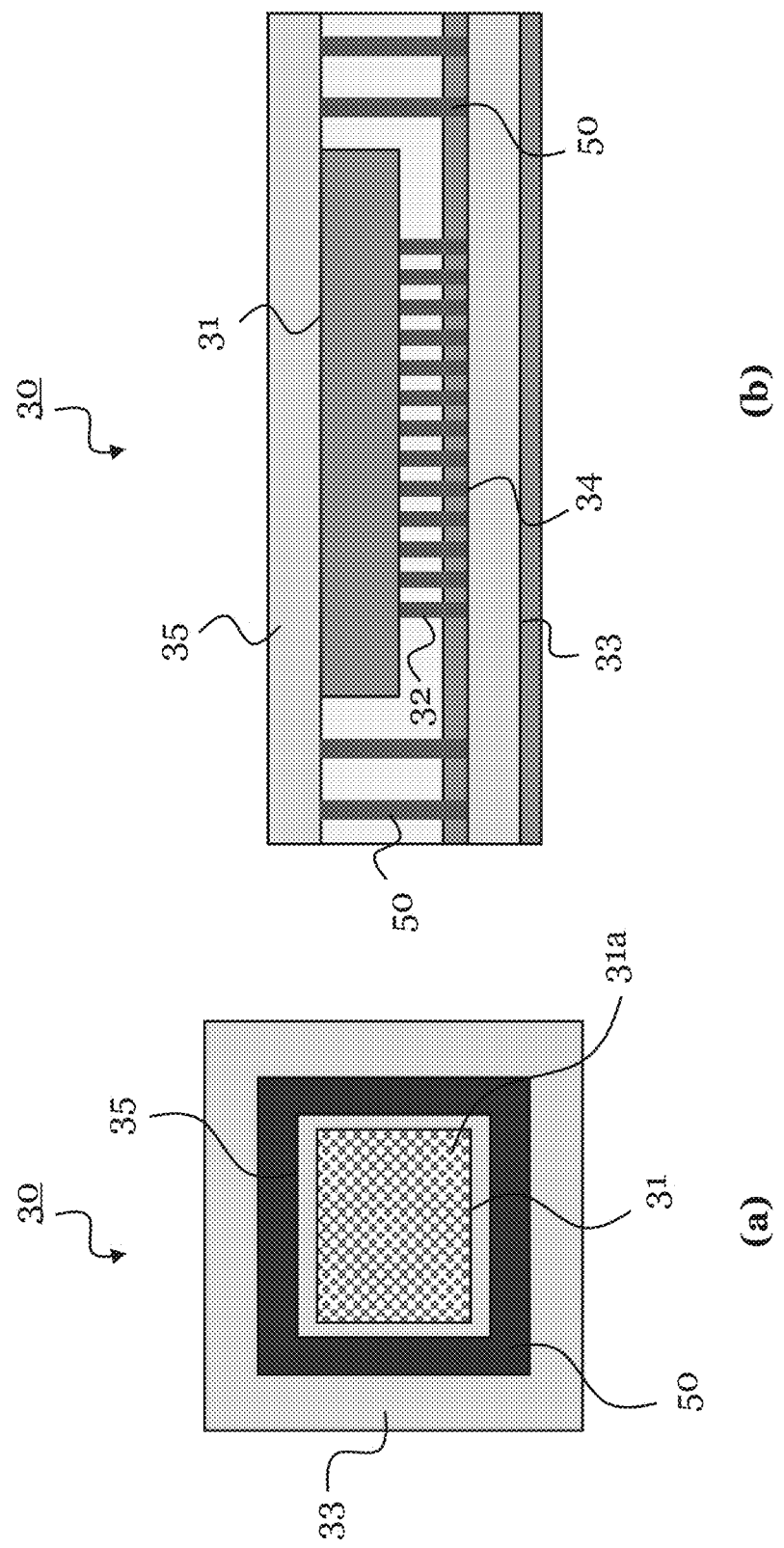
FIG. 5 shows an overall schematic layout of an optical device according to an example embodiment in (a) a top view and (b) a cross-sectional view.

FIG. 5 shows in (a) a top view of an optical device 30 according to an example embodiment, and shows in (b) a cross-section of an optical device 30 according to an example embodiment. The two shown optical devices 30 may be the same and may be based at least in part on the optical device 30 shown in FIG. 3.

In particular, FIG. 5(a) shows a top level layout of the optical device 30 including the first semiconductor part 30a with the array 31 and the top contact 35, and the second semiconductor part 30b with the CMOS IC 33. In the active array 31 a very dense, high aperture array of compound semiconductor μLEDs or μPDs 31a can be generated without any VIAs. Of course the top contact 35 of the array 31 can be connected to the CMOS IC 33 as well, so that the CMOS IC can drive and/or readout the array 31. This connection, however, is fabricated outside e.g. the emissive LED array 31 area. In particular, the top contact 35 may be electrically connected to the CMOS IC 33 by at least one electrical connection element 50 arranged outside of the LED/PD array 31. The electrical connection element 50 may be a VIA. In the top view of the array 31, the VIA 50 may surround the array 31. The CMOS IC 33 is thus configured to drive/readout each LED or PD 31a with the top contact 35 and the bottom contact 32 (32a+32b) connected to that LED or PD 31a.

This electrical connection of the common transparent top contact 35 with a VIA to the underlying CMOS IC cannot be done in the transparent top contact layer 35 for itself since commonly used transparent conductors like ITO will oxidize during deposition and post anneal any below laying metal contact that forms the Via like Cu or Al. To form a good electrical connection of one metal layer with a transparent conductor, the metal conductor lands on the ITO and not the ITO lands on the metal conductor. The example embodiments provide for limiting the transparent contact 35 area to the actual LED array size and using the additional metal layer 40 and posts 41 on top of the transparent contact to route the electrical signal to the via outside the LED array which connects to the CMOS IC.

The at least one electrical connection element 50 is also illustrated in FIG. 5(b). As an example, four electrical connection elements 50 are shown, two on each side of the array 31 in the cross-sectional view. Each electrical connection element 50 connects the top contact 35 to the CMOS IC 33. The top contact 35 may electrically be separated into different top contact regions, e.g., each contact region being connected with one electrical connection element 50 to the CMOS IC 33.

As can also be seen in FIG. 5(*b*), each of the electrical connection elements 50 is passed by the array 31. The electrical connection elements 50 may also be passed around the array 31, particularly in a non-straight manner. It can further be seen in FIG. 5(*b*) that the four electrical connection elements 50 are arranged with a lower density than the plurality of first contacts 32 and second contacts 34, respectively. This means, the electrical connection elements 50 are spaced further apart from one another than the first contacts 32 and second contacts 34, respectively. For example, a distance between two adjacent VIAs 32*b* may be in the order of the pixel pitch between 1-10 μm, but preferably 3 μm or less. A distance between adjacent electrical connection elements 50 may be larger than 3 μm, and even larger than 10 μm. Consequently, fewer electrical connection elements 50 are arranged in a certain area than first and second contacts 32 and 34, respectively.

Figure 6:
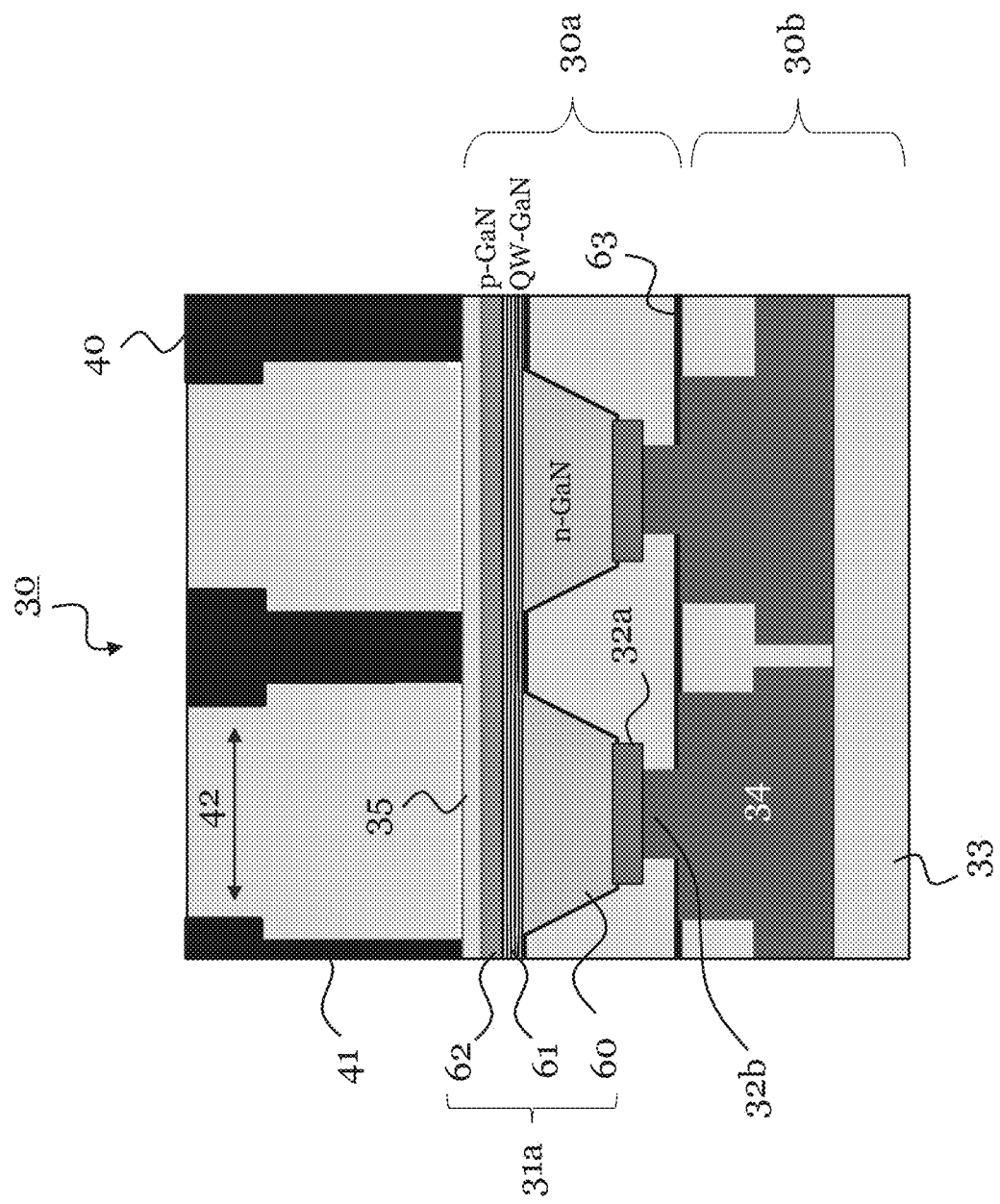
FIG. 6 shows a schematic cross-section of a LED device according to an example embodiment. The LED device can be realized with a method including a partial MESA etch.

FIG. 6 shows an LED device 30, particularly a μLED device, according to an example embodiment in a cross-section. Same elements in FIG. 6 and the previous figures share the same reference signs and function likewise. The LED device 30 of FIG. 6 has also the metallization grid 40 shown in FIG. 4, but could also be designed without it like the LED device 30 in FIG. 3.

In particular, the LED device 30 shown in FIG. 6 is obtained by a partial MESA etch as described above with respect to FIG. 2. The epi LED layers include, for each LED 31*a* of the LED array 31, quantum well layers 61, a first highly-doped contact layer 60 (by way of example, shown to be a n-type contact layer but could also be p-type) below the quantum well layers 61, and a second highly-doped contact layer 62 (by way of example, shown to be a p-type contact layer but could also be n-type) above the quantum well layers 61. The quantum well layers 61 and the second-highly doped contact layer 62 were not etched in the partial MESA etch. In other words, these layers 61, 62 extend over the whole LED array 31 in the LED device 30 and are thus common to the LEDs 31*a*. The first highly-doped contact layer 60 was etched during the partial MESA etch, so that each of the LEDs 31*a* in the LED array 31 has an individual highly-doped contact layer 60.

The second highly-doped contact layer 62 above the quantum well layers 61 is contacted by the (common) top contact 35 from above. Each first highly-doped contact layer 60 is contacted by a bottom contact 32*a* from below—and further through a VIA 32*b*, across the bonding surface 63 between the first semiconductor part 30*a* and the second semiconductor part 30*b*, and through one of the second contacts 34 to the CMOS IC 33.

The method 10, optical device 30, and LED device 30 according to example embodiments—as shown in FIG. 1-6—allow for achieving an increased resolution (i.e., reduced LED pixel pitch) with very little brightness drop of the scaled LED pixels. In addition, the method 10 is fully compatible with an advanced 300 mm fab. Implementing the method 10 on a 300 mm platform may lead to further benefits, for instance, a logic wafer can be used in a more advanced node, e.g., 55 nm, which enables even more performance.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for fabricating an optical device, the method comprising:
    processing an array including a plurality of compound semiconductor light emitting diodes (LEDs) or compound semiconductor photodiodes (PDs) on a first semiconductor wafer;
    processing a plurality of first contacts on the first semiconductor wafer, each first contact being electrically connected to one of the LEDs or PDs from below;
    processing a Complementary Metal-Oxide-Semiconductor (CMOS) integrated circuit (IC) on a second semiconductor wafer;
    processing a plurality of second contacts electrically connected to the CMOS IC on the second semiconductor wafer; and
    hybrid bonding the first semiconductor wafer to the second semiconductor wafer such that the plurality of LEDs or PDs are individually connected to the CMOS IC via the first and second contacts,
    wherein the array includes a plurality of LEDs and processing the array on the first semiconductor wafer comprises:
        growing or transferring LED layers on the first semiconductor wafer, wherein the LED layers include quantum well layers and a highly-doped contact layer on the quantum well layers; and
        structuring the plurality of LEDs by etching the LED layers, wherein the highly-doped contact layer is etched but the quantum well layers are not etched.

2. The method according to claim 1, wherein the array is processed without any vertical interconnect access (VIA) through the array between the plurality of LEDs or PDs.

3. The method according to claim 1, wherein processing, before the hybrid bonding, the plurality of first contacts on the first semiconductor wafer comprises:
    processing a plurality of contact layers, each contact layer being applied to a bottom surface of a different one of the LEDs or PDs; and
    processing a plurality of vertical interconnect access (VIAs), each VIA being electrically connected to one of the contact layers from below and extending from the contact layer to a bonding surface of the first semiconductor wafer.

4. The method according to claim 3, wherein a size of each contact layer is equal to or smaller than a size of an active area of the LED or PD, to which it is applied.

5. The method according to claim 1, further comprising, after the hybrid bonding:
    processing at least one third contact on the first semiconductor wafer, the at least one third contact being electrically connected to the plurality of LEDs or PDs from above.

6. The method according to claim 5, wherein the at least one third contact is transparent for LED light or light to be captured by the PDs and is connected to several or to each of the plurality of LEDs or PDs.

7. The method according to claim 5, further comprising, after the hybrid bonding:

processing at least one electrical connection element, particularly a vertical interconnect access (VIA), connecting the at least one third contact to the CMOS IC, wherein the electrical connection element is passed by or around the array.

8. The method according to claim 7, wherein a plurality of electrical connection elements is processed, the plurality of electrical connection elements being arranged with a lower density than the plurality of first contacts and second contacts.

9. The method according to claim 5, further comprising, after the hybrid bonding:
processing a conductive grid, particularly using a damascene process, electrically connected to the at least one third contact from above.

10. The method according to claim 1, wherein the array has a pixel pitch of the plurality of LEDs or PDs between 1-10 μm.

11. The method according to claim 1, wherein the array has a pixel pitch of the plurality of LEDs or PDs equal to or below 3 μm.

12. An optical device, comprising:
a first semiconductor part comprising:
an array including a plurality of compound semiconductor light emitting diodes (LEDs) or compound semiconductor photodiodes (PDs); and
a plurality of first contacts, each first contact being electrically connected to one of the LEDs or PDs from below; and
a second semiconductor part arranged below the first semiconductor part and comprising:
a Complementary Metal-Oxide-Semiconductor (CMOS) integrated circuit (IC); and
a plurality of second contacts electrically connected to the CMOS IC;
wherein the first semiconductor part is hybrid bonded to the second semiconductor part, and the plurality of first contacts are directly connected one-by-one to the plurality of second contacts, and
wherein at least one third contact is electrically connected to the CMOS IC by at least one electrical connection element arranged outside of the array.

13. The optical device according to claim 12, wherein the array comprises no vertical interconnect access (VIA) between the plurality of LEDs or PDs.

14. The optical device according to claim 13, wherein
the at least one third contact is electrically connected to the plurality of LEDs or PDs from above, and
the at least one third contact is transparent for LED light or light to be captured by the PDs and is connected to several or to each of the plurality of LEDs or PDs.

15. The optical device according to claim 12, wherein:
the at least one third contact is electrically connected to the plurality of LEDs or PDs from above, and
the at least one third contact is transparent for LED light or light to be captured by the PDs and is connected to several or to each of the plurality of LEDs or PDs.

* * * * *